United States Patent
Matsunaga

(10) Patent No.: US 10,625,297 B2
(45) Date of Patent: Apr. 21, 2020

(54) METHOD OF APPLYING POWDER OR GRANULAR MATERIAL

(71) Applicant: Mtek-smart Corporation, Yokohama-shi, Kanagawa (JP)

(72) Inventor: Masafumi Matsunaga, Yokohama (JP)

(73) Assignee: Mtek-smart Corporation, Yokohama-shi, Kanagawa (JP)

( * ) Notice: Subject to any disclaimer, the term of this patent is extended or adjusted under 35 U.S.C. 154(b) by 300 days.

(21) Appl. No.: 15/319,870

(22) PCT Filed: Dec. 2, 2014

(86) PCT No.: PCT/JP2014/081877
§ 371 (c)(1),
(2) Date: Dec. 19, 2016

(87) PCT Pub. No.: WO2016/059732
PCT Pub. Date: Apr. 21, 2016

(65) Prior Publication Data
US 2017/0136492 A1    May 18, 2017

(30) Foreign Application Priority Data
Oct. 18, 2014 (JP) .................................. 2014-213252

(51) Int. Cl.
*B05D 1/12* (2006.01)
*H01L 33/50* (2010.01)
(Continued)

(52) U.S. Cl.
CPC .................. *B05D 1/12* (2013.01); *B05D 3/06* (2013.01); *C23C 24/04* (2013.01); *H01L 33/505* (2013.01);
(Continued)

(58) Field of Classification Search
CPC .... B05B 7/1404; B05B 7/1459; B05B 7/1472
See application file for complete search history.

(56) References Cited

U.S. PATENT DOCUMENTS

| 4,940,185 A * | 7/1990 | Fu ........................... B05B 7/241 |
| | | 239/126 |
| 5,615,830 A * | 4/1997 | Matsunaga ........... B05B 5/1683 |
| | | 222/368 |

(Continued)

FOREIGN PATENT DOCUMENTS

| JP | H05-76869 A | 3/1993 |
| JP | H07-172575 A | 7/1995 |

(Continued)

OTHER PUBLICATIONS

International Search Report from International Patent Application No. PCT/JP2014/081877, dated Mar. 24, 2015.

*Primary Examiner* — Robert A Vetere
(74) *Attorney, Agent, or Firm* — SGPatents PLLC

(57) ABSTRACT

[Object] To apply or deposit powder or granular material onto a required portion of an object by a required quantity precisely at low cost, to make the weight per unit area smaller than one square centimeter or square millimeter uniform, and to make the use efficiency of powder or granular material as close to 100% as possible.
[Solution] Firstly layers of powder or granular material is formed on a substrate with a uniform weight per unit area, and then the powder or granular material on the substrate is sucked and ejected toward the object to form layers or films.

20 Claims, 11 Drawing Sheets

(51) Int. Cl.
*H05B 33/10* (2006.01)
*C23C 24/04* (2006.01)
*B05D 3/06* (2006.01)

(52) U.S. Cl.
CPC ...... *H05B 33/10* (2013.01); *H01L 2933/0041* (2013.01)

(56) References Cited

U.S. PATENT DOCUMENTS

| | | | | |
|---|---|---|---|---|
| 6,402,500 | B1* | 6/2002 | Zahrah | B22F 3/004 141/67 |
| 7,301,175 | B2* | 11/2007 | Izuno | H01L 21/76251 257/100 |
| 2002/0100817 | A1* | 8/2002 | Schroeder | B05B 5/032 239/112 |
| 2002/0187571 | A1* | 12/2002 | Collins, III | C25D 13/02 438/29 |
| 2004/0037954 | A1* | 2/2004 | Heinrich | C23C 24/04 427/180 |
| 2013/0243535 | A1* | 9/2013 | Volonte | B05B 7/1404 406/34 |

FOREIGN PATENT DOCUMENTS

| | | |
|---|---|---|
| JP | 2001-170551 A | 6/2001 |
| JP | 2006-313829 A | 11/2006 |
| JP | 2013-144279 A | 7/2013 |
| WO | WO 2014/171535 A1 | 10/2014 |

* cited by examiner

METHOD OF APPLYING POWDER OR GRANULAR MATERIAL

TECHNICAL FIELD

The preset invention relates to a method of applying or depositing a powder or granular material onto an object. The invention includes, for example, a method for applying a phosphor in the form of powder or granule to an LED or LED component to produce a high-quality LED or LED component.

More specifically, a phosphor in the form of powder or granule or a slurry made of a phosphor and a solvent may be applied to a substrate, e.g. a metal such as a stainless steel, a composite layer coated on a metal surface, a ceramic plate, a rubber plate and a plastic film, or to a breathable substrate such as a paper, then volatile components may be evaporated in the case where a slurry is used, and then the phosphor on the substrate may be sucked and applied to an LED or LED component set in a vacuum atmosphere. Alternatively, a powder or granular material may be uniformly applied to a substrate to form a thin film, and the powder or granular material on the substrate may be sucked by means of an ejector system and applied to an object through a channel such as a tube.

The LED component refers to a component used in the process of producing an LED, which includes, but not limited to, a plate made of e.g. a ceramic material and a transfer film for phosphor or what is called a phosphor sheet.

The means for application includes, but not limited to, a dispenser, a throttle nozzle, atomization application, electrostatic atomization application, continuous or pulsed spray, electrostatic spray, inkjet, screen spray, screen printing, and roll coating.

The substrate may be a sheet, a plate, a cylinder, a disk, a long plastic film, a metal roll stock, a breathable clean paper, a breathable film, or a breathable ceramic plate. The substrate may have any dimension, shape, and thickness. It is preferred that the substrate has breathability because the breathability allows powder or granular material to be transferred downstream as an ideal gas-powder mixture when it is sucked.

BACKGROUND ART

In prior arts, a slurry is prepared by mixing a YAG phosphor and a binder such as a silicone, and the slurry is applied to a blue light LED by a dispenser or the like to change light emission characteristics.

Patent Literature 1 owned by the applicant of this patent application discloses a technique of applying a phosphor to a surface and a side of an LED to which it is not possible to apply a phosphor by a dispenser to form a thin film while controlling the quantity of the phosphor applied.

Patent Literature 2 discloses a method for manufacturing a white light emission diode including a blue light emission diode and phosphor layers for conversion into yellow light and red light, which phosphor layers are produced by aerosol-depositing fluorescent particles on the blue light emission diode.

Patent Literature 3 discloses a method invented by the same inventor as that of the present invention. Patent Literature 3 discloses a method called screen spray, in which openings of a rotary screen are filled with a powder or granular material by a positive displacement system, and then the powder or granular material is extruded out to the side opposite to the filling side by compressed gas or the like for application.

In cases where a slurry is applied using ordinary dispensing or spraying, not only a slurry layer formed on the surface of an LED but also a slurry layer formed on the side of the LED is not uniform, and the color temperature is not uniform among the portions of the chip, leading to critical defects such as yellowing or bluing.

As a countermeasure to this problem, filling of slurry is performed using a dam around an LED chip or using a reflector. This makes the process complex and requires to make the quantity of binder such as silicone resin larger than the quantity of phosphor in order to improve fluidity of slurry, which makes the film thickness larger than required, leading to deteriorated performance due to light loss.

By the method disclosed in Patent Literature 1, the proportion of phosphor can be made larger, and a thin layer can be formed on an LED directly. Therefore, high quality LEDs with small light loss can be produced by this method. Moreover, a uniform thin layer can be formed not only on the top surface of an LED but also on the side surface. For this reason, this method has been receiving attention as a method that can manufacture high-added-value LED packages.

Generally, the area ratio of a substrate and an LED chip on the substrate is between ¼ and ⅟30, and phosphor is applied on the entirety of the substrate. Therefore, the use efficiency of phosphor is very low.

Moreover, in cases where molding of a lens using a silicone resin or the like is performed afterward, a mask is used so as not to coat the portions around the LED to prevent deterioration in adhesion of the silicone resin for molding and a phosphor rich layer around the LED. The phosphor adhering to the mask contains reactive curing silicone, and it is difficult to recycle it.

In aerosol deposition disclosed in, for example, Patent Literature 2, a deposited film can be formed on an object by setting the object in a chamber kept at a high degree of vacuum of e.g. 0.4 to 2 Torr, fluidizing powder or granular material by gas, and transferring micro particles of ceramics or the like having diameters of 0.08 to 2 micrometers by energy of differential pressure higher than 50 kPa to cause them to impinge on the object at a speed higher than 150 m/sec. However, since it employs fluidization, there still remains the problem of film thickness distribution in the deposited film per microscopic unit area, because even on the aforementioned micron order, the aforementioned smaller size particles and larger size particles show different flow behaviors, even if a pulverizer or classifier is used. Moreover, if deposition is performed with phosphor having an average particle diameter of 15 micrometers, there arises a problem that a portion of an LED such as a wire is broken by impact energy.

The average particle diameter of yellow phosphor for LEDs is generally between 7 and 30 microns. There is a variation in particle size as a matter of course. For example, in the case where the average particle diameter is 15 microns, the particle size distribution spreads between several microns and 60 microns. Therefore, the particle concentration is uneven in the fluidized state. Since the weight of phosphor per square centimeter is very small (e.g. 5 mg or so in the case of the normal white color temperature), and the particles move in several milliseconds when transferred, the variation per unit time is large. If the phosphor is fluidized in a fluidization chamber with an increased quantity of gas, namely with a decreased concentration of the phosphor, it is difficult to stabilize the application quantity with the lapse of time, because heavy particles tend to sink and light particles tend to float.

CITATION LIST

Patent Literature

Patent Literature 1: Japanese Patent Application Laid-open Publication No. 2013-144279
Patent Literature 2: Japanese Patent Application Laid-open Publication No. 2006-313829
Patent Literature 3: Japanese Patent Application Laid-open Publication No. H05-76869

SUMMARY OF INVENTION

Technical Problem

To solve the problems when using the above-described aerosol deposition or other similar method, it is necessary to make the weight of phosphor per unit area, e.g. one square millimeter uniform in the phosphor supplying side. Moreover, it is necessary to enhance the overall use efficiency of phosphor by recycling, thereby improving cost competitiveness.

It might be considered that the method of applying powder or granular material to an object by positive displacement like the method disclosed in Patent Literature 3 can achieve uniform application weight. It is true that it can provide relatively high quality coating in the field of ordinary powder coating, but it is not suitable for application in which it is necessary to control the application weight in 0.1 milligram per square centimeter order, as with coating of an LED with phosphor, because the coating weight varies with variation in the bulk density of powder or granular material.

Solution to Problem

The present invention has been made to solve the above problem, and an object of the present invention is to improve the use efficiency of powder or granular material and to recycle powder or granular material, thereby saving resources. For example, in the case of application to an LED, the present invention can provide an LED or LED component with equalized coatng weight of applied phosphor per unit area with a reduced quantity of phosphor used, that is ¼ to ⅟30 of the quantity with prior art methods.

According to the present invention, there is provided a method for applying a powder or granular material by sucking a powder or granular material on a substrate, transferring it, and ejecting it toward an object comprising: the first step of applying at least one kind of powder or granular material to a substrate in such a way that the quantity per unit area of the applied powder or granular material is made uniform; the second step of bringing a suction port for sucking the powder or granular material on the substrate and an ejection port for ejecting the powder or granular material toward the object in communication with each other; the third step of providing means for creating a differential pressure between said suction port and the ejection port; the fourth step of bringing said suction port close to or in contact with the substrate to suck said powder or granular material; the fifth step of applying the powder or granular material to said object through said ejection port while branching the upstream of the ejection port for the powder or granular material to discharge surplus gas through a branch port.

According to the present invention, it is preferred that said means for creating a differential pressure be an ejector pump system.

According to the present invention, there is provided a method of applying a powder or granular material characterized in that the means for creating a differential pressure sets at least the object, the branch discharge port, and the ejection port in a vacuum to create a differential pressure, thereby applying or depositing the powder or granular material onto the object.

According to the present invention, there is provided a method of applying a powder or granular material characterized in that the powder or granular material is applied to said substrate in thin layers.

According to the present invention, there is provided a method of applying a powder or granular material characterized in that application of the powder or granular material to said substrate is performed by relative movement of the substrate and an applicator, and 2 to 200 thin layers each having a coating weight per square centimeter of 0.01 to 5 milligrams are formed.

According to the present invention, there is provided a method of applying a powder or granular material characterized in that said powder or granular material is a slurry made of a powder or granular material and a solvent, and said applicator is an atomizing device, which applies the slurry to the substrate.

According to the present invention, it is preferred that said atomizing device be a spray device or a pulsed spray device, and said substrate or the spray device be moved pitch-by-pitch so that multiple coating layers are formed with the pitch phase being varied.

According to the present invention, there is provided a method of applying a powder or granular material characterized in that the powder or granular material is applied to said object in 2 to 200 layers.

According to the present invention, there is provided a method of applying a powder or granular material by sucking a powder or granular material on a substrate, transferring it, and ejecting it toward an object comprising: the first step of applying at least one kind of powder or granular material to a substrate in such a way that the quantity per unit area of the applied powder or granular material is made uniform; the second step of bringing a suction port for sucking the powder or granular material on the substrate and an ejection port toward the object in communication with each other; the third step of providing channel closing means between said suction port and the ejection port; the fourth step of setting at least said object and the ejection port in vacuum to create a differential pressure between the suction port and the ejection port; and the fifth step of bringing said suction port close to or in contact with the substrate while opening said channel closing means to suck said powder or granular material and applying or depositing the powder or granular material onto said object by ejecting the powder or granular material from said ejection port to the object.

According to the present invention, there is provided a method of applying a powder or granular material characterized in that the number of the suction ports for said substrate, the ejection ports toward the object, and the communication channels is 2 to 1500.

According to the present invention, there is provided a method of applying a powder or granular material characterized in that a binder is coated to the object beforehand.

According to the present invention, there is provided a method of applying a powder or granular material characterized in that said powder or granular material is a phosphor, and said object is an LED or an LED component.

According to the present invention, there is provided a method of applying a powder or granular material characterized in that said phosphor is applied to the substrate in a pattern.

According to the present invention, there is provided a method of applying a powder or granular material characterized in that said binder is a silicone, and said LED or said LED component is at least partly covered with the silicone or a slurry made of the silicone and the phosphor.

According to the present invention, there is provided a method of applying a powder or granular material characterized in that the phosphor on the substrate comprises layers of phosphor of different colors.

According to the present invention, there is provided a method of applying a powder or granular material characterized in that phosphor of a plurality of colors, each phosphor being single-colored, are applied to a plurality of substrates, and the phosphor is applied to the LED or the LED component in multiple layers.

As above, according to the present invention, it is possible to apply a powder or granular material such as a phosphor to a breathable substrate or a substrate at least the surface of which has rubber elasticity to allow the phosphor to adhere to it by the cushion effect in layers or to apply a slurry made of a phosphor and a solvent to a substrate in layers and to vaporize the solvent, then to suck and transfer the phosphor on the substrate, and, in cases where the phosphor is to be applied to an object such as an LED or LED component in a vacuum chamber, to apply the phosphor onto the object to form layers of the phosphor having a specific gravity of 4 at a small coating weight per layer of e.g. 0.01 to 5 mg per square centimeter while keeping the bulk density of the phosphor on the substrate uniform. In cases where it is desired that the quantity of the phosphor in one layer be small, a slurry in which the phosphor is diluted to 50 wt % or lower, preferably 5 wt % or lower may be prepared and the slurry may be applied to the substrate by, for example, pulsed spaying. By this method, it is possible to form dispersed layers of powder or granular material at a surprisingly low coating weight of 0.1 mg per square centimeter by ten layers.

In cases where a binder such as a silicone is used, it is necessary to choose a solvent having compatibility with the binder such as a silicone. In the present invention, an organic solvent, in particular ethanol or other alcoholic solvent that is not hazardous to humans, a monomer, water, a mixture of them, liquefied carbon dioxide, a supercritical fluid, or a mixture of a solvent and absolute glycerin added for the purpose of increasing the viscosity may be used as the solvent, so long as the solvent does not affect the properties of the phosphor.

As above, the method according to the present invention allows the use of a wide variety of carrier media in solvent. Moreover, in the case where an ultrasonic atomizing device or a two fluid spray device is employed as the atomizing device, even if there are few bubbles in the slurry, the bubbles can be removed in the process of atomization. If the substrate and the spray device are moved relative to each other in a closed small booth during application, the solvent can be recycled. Moreover, the method disclosed in WO2013/03953A1, which was invented by the applicant of the present patent application, may be employed to prevent sedimentation. The splay device and the substrate may be moved pitch-by-pitch with an offset to form a desired number of thin layers of phosphor in the range between 2 and 200. By forming multiple layers, it is possible to form a thin film having a uniformized particle diameter distribution with a variation of the coating weight per unit area kept within ±5%, preferably ±1.5% even in the case where the phosphor has the grain size distribution shown in FIG. 9. Consequently, the coating weight on the object can also be made uniform The substrate may be, for example, a cylinder, a flat plate, a block, a film such as a web, a coil, a breathable clean paper, or a breathable film. The substrate may have any shape, material, and size. To reduce contamination by the substrate, it is preferred that the material of the substrate be a high-hardness material of the same kind as the powder or granular material or a ceramic material that can prevent abrasion or break-off of the substrate or can keep abrasion or break-off of the substrate within a negligible level. When a metal substrate is used, it is preferred that its surface be mirror finished. Alternatively, coating with a ceramic material or plating may be applied to it. A binder such as a silicone may be applied beforehand and gelatinized. This can provide a cushion effect for the phosphor powder in spraying, thereby improving the coating efficiency. Moreover, this eliminates the possibility of contamination.

The substrate may be a disk or a plate provided with recessed portions and projecting portions, and only the phosphor in the recessed portions or on the projecting portions may be sucked. In cases where a powder or granular material having a widespread grain size distribution is used, a conductive material may be used as the substrate, or the substrate may be made conductive by processing, and application may be performed in multiple layers with the phase varied while utilizing static electricity. This enables application of ultrafine particles, further improving the degree of uniformity in the coating weight. To improve the electrical charge effect further, powder or granular material or phosphor may be capsulated by a polymer, or a polymer may be attached to the phosphor. If an easily chargeable solvent is used, the solvent adhering to particles of phosphor will be charged to improve the efficiency of application.

Advantageous Effect of the Invention

As above, by the method according to the present invention, application or deposition of a powder or granular material such as a phosphor on a substrate or an object such as an LED or LED component can be made uniform in a microscopic sense. By using a differential pressure of aerosol deposition, high quality deposition of a powder or granular material such as a phosphor can be achieved at low cost. In the method according to the present invention, the powder or granular material such as phosphor on the portions of the substrate that are not used can be recycled thanks to the absence of binder, and the use efficiency of the phosphor reaches nearly 100%. Therefore, if the present invention is applied to application of phosphor to an LED or LED component, the cost of the material such as phosphor can be reduced by ten times or more without relying on conventional methods. This contributes not only to cost reduction but also to resource saving greatly.

DESCRIPTION OF EMBODIMENTS

In the following, preferred embodiments of the present invention will be described with reference to the drawings. The following embodiments are given only for the illustrative purpose to facilitate the understanding of the invention, and not intended to exclude feasible additions, replacements, modifications made thereto by persons skilled in the art without departing from the technical scope of the present invention.

The drawings schematically show preferred embodiments of the present invention.

Figure 1:
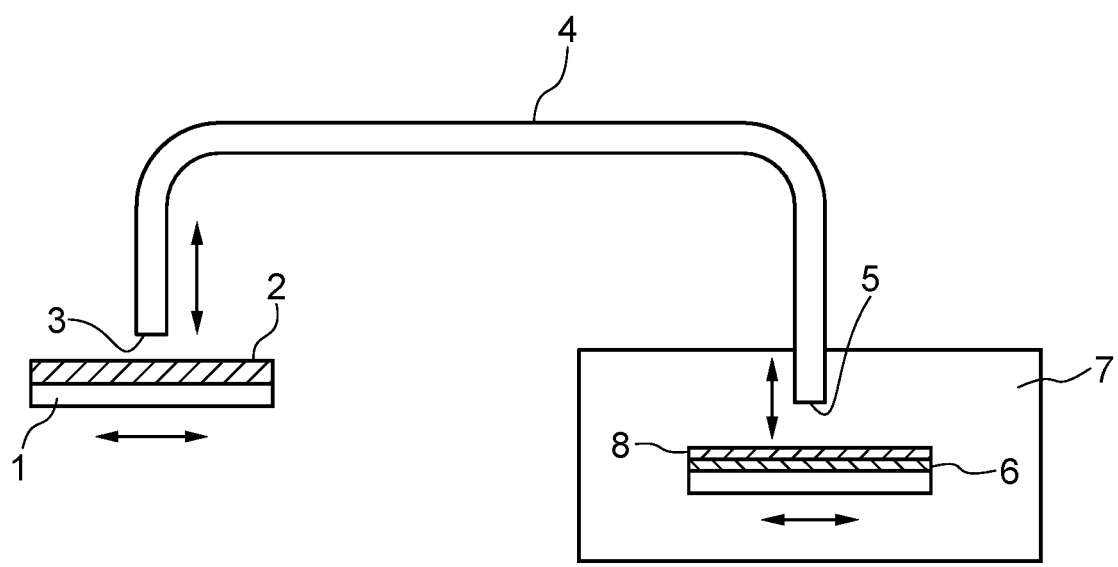
FIG. 1 is a schematic cross sectional view illustrating the present invention.

Referring to FIG. 1, a powder or granular material 2 is applied onto a substrate 1 with a controlled uniform weight per unit area. An allowable degree of uniformity in the weight is ±5% of the designated value of the weight per square centimeter, and preferably ±1.5%. For example, in the case where the designated weight per square centimeter is 0.6 mg, the allowable variation is ±0.03 mg or ±0.009 mg. The powder or granular material can be sucked easily by bringing the suction port 3 to the proximity of or in contact with the surface of the powder or granular material 2. The powder or granular material is transferred by differential pressure from the suction port 3 to an ejection port 5 through a communication channel 4 that is in communication thereto and applied to an object 6 such as an LED or LED component to form a coating layer 8. The ejection port may be a nozzle. The ejection port may have any shape such as a circular, rectangular, or slit-like shape and any size and may be made of any material, but it is preferred that the ejection port has a selected shape and size suitable for the shape of the object such as an LED or LED component. The means for uniformizing the weight of the powder or granular material per unit area on the substrate may apply the powder or granular material in as many layers as possible, e.g. in 100 layers. This uniformizes the distribution of the applied powder or granular material 6, so that the weight of the coating per unit area can be made uniform. Alternatively, a plurality of substrates having a single or multiple layers of applied material may be prepared, and laminated layers may be formed one after another for the purpose of averaging. When the object 6 such as an LED or LED component is coated with the powder or granular material ejected from the ejection port 5, coating may be performed not in a single layer but in multiple thin layers with the weight per unit area being made as small as possible, whereby the weight of the powder or granular material such as a phosphor coated on the object can be improved. When forming a coating layer or layers on the substrate or the object, it is preferred that the application means and the substrate, and the suction port and the substrate, or the ejection port and the object be moved relative to each other. The differential pressure may be created using an ejector. Alternatively, a negative pressure (or vacuum) may be established in a coating chamber 7 in which the object is placed to create a differential pressure between the suction port 3 and the ejection port 5 thereby sucking the powder or granular material and applying it onto the object. The differential pressure may be set higher than 50 kPa thereby making the ejection speed of the powder or granular material higher than 150 m/sec to cause it to impinge on the object, whereby it is possible to form a film of the powder or granular material such as phosphor. The differential pressure higher than 50 kPa mentioned above is that on the higher vacuum side.

Figure 2:
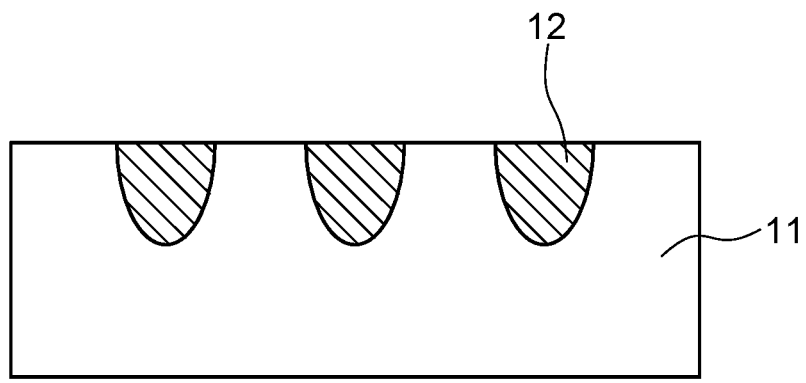
FIG. 2 is a schematic cross sectional view of a substrate according to an embodiment of the present invention.

Referring to FIG. 2, a substrate 11 is provided with recessed portions and projecting portions. Powder or granular material 12 is applied to the substrate 11. If necessary, phosphor overflowing out of the recessed portions is removed. The powder or granular material 12 in the recessed portions or on the projecting portions may be sucked and applied onto an object such as an LED or LED component in a spot or spotwise. This operation may be performed repeatedly to form a layer.

Figure 3:
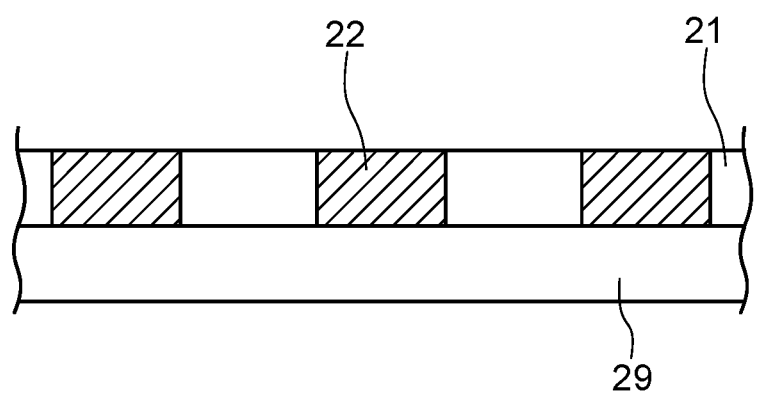
FIG. 3 is a schematic cross sectional view of a substrate according to an embodiment of the present invention.

Referring to FIG. 3, through holes of a substrate 21 or openings of a screen are filled with powder or granular material 22. A leakage prevention plate or a breathable mesh 29 having a mesh size smaller than the particle size of phosphor may be provided below the substrate to allow air to pass through the mesh in spray coating or to allow suction to be applied through the mesh 29 to achieve ideal filling.

Figure 4:
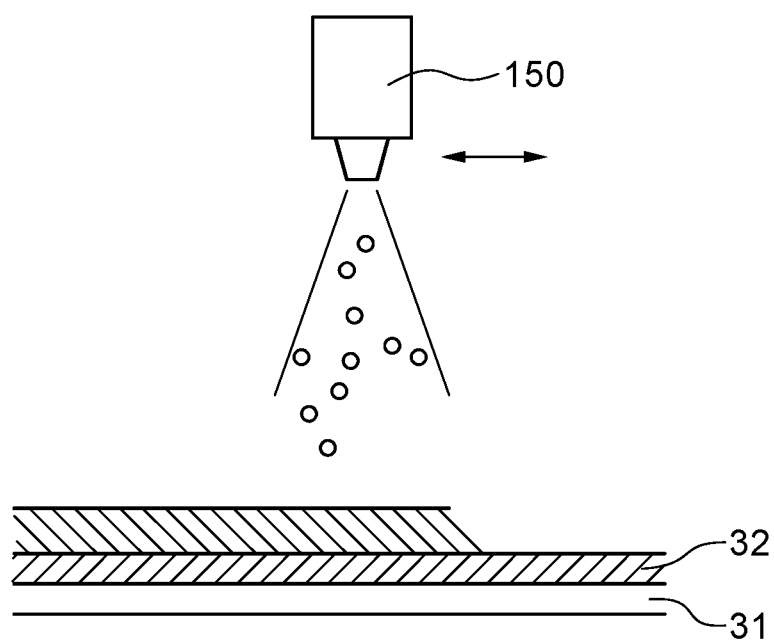
FIG. 4 is a schematic cross sectional view illustrating application to a substrate according to an embodiment of the present invention.

Referring to FIG. 4, multilayer coating with powder or granular material is performed while a substrate 31 and an applicator 150 are moved relative to each other. The applicator 150 may be a slurry atomizer utilizing ultrasonic waves or rotary atomizer. Particles of a phosphor or the like and/or the substrate is electrically charged so that a uniform layer of powder or granular material can be formed. The powder or granular material may be mixed with a solvent, and the resultant slurry may be applied to the substrate by die coating or spraying to form multiple coating layers. In the case of spraying, the surface of the substrate may be electrically grounded and the spray particles may be electrically charged. Attaching the material to the substrate in the form of slurry is more preferable than in the form of powder in achieving higher initial adhesiveness and coating with uniform bulk density of the powder or granular material in the coating layer. It is ideal that pulsed spray coating onto the substrate with a material be performed with intermittent supply of gas, because the flow rate per unit time can be reduced, the coating can be made thin, and the coating efficiency can be enhanced. In the case of coating with atomized slurry, the object such as an LED may be heated when coating is performed in a pulsed manner to form multiple thin layers so that the solvent can be vaporized instantly.

Figure 5:
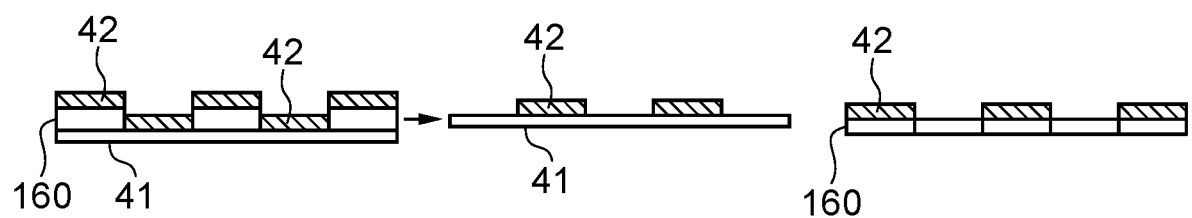
FIG. 5 is a schematic diagram illustrating application of phosphor to a substrate using a mask according to an embodiment of the present invention.

Referring to FIG. 5, a mask 160 is set on a substrate 41. Thus, a pattern 42 of powder or granular material having a desired shape and thickness can be formed. This method is advantageous in that the powder or granular material such as a phosphor can be applied to desired portions of an LED or the like in a spot or spotwise. The phosphor on the mask can be collected and reused. Collected phosphor can be used in the form of powder or granule or can be used in slurry again to form thin multiple layers.

Figure 6:
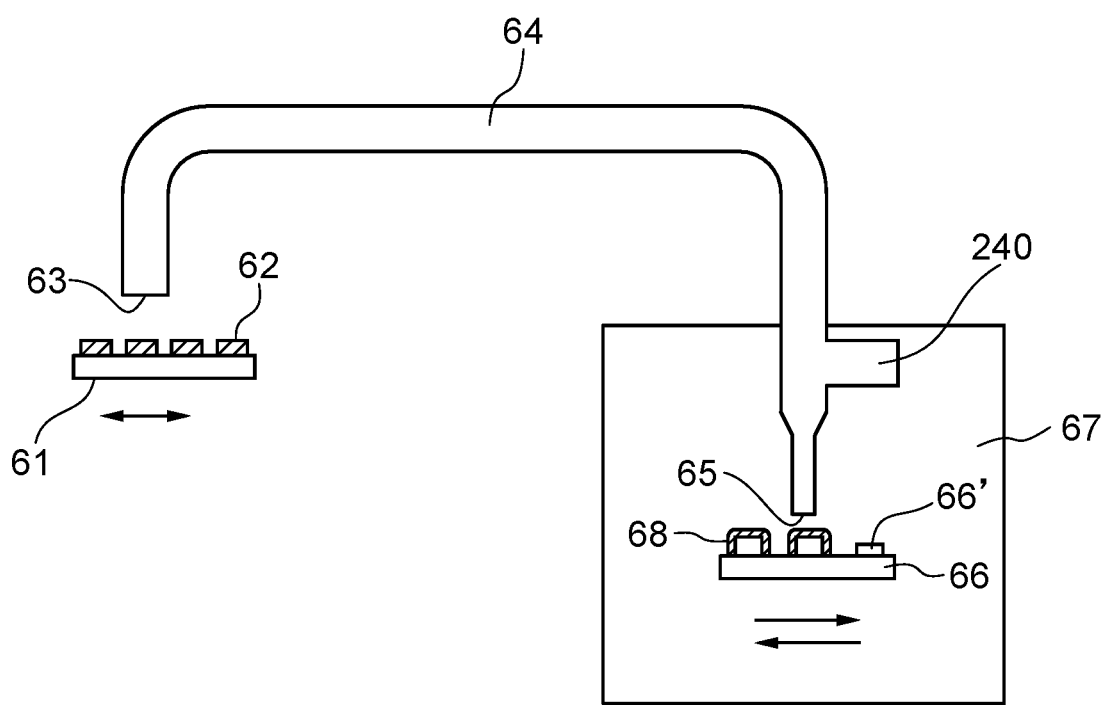
FIG. 6 is a schematic cross sectional view illustrating an embodiment of the present invention.

Referring to FIG. 6, by a certain contraption, the patterned powder or granular material 62 such as a phosphor shown in FIG. 5 can be transferred to a vacuum chamber 67 kept at negative pressure and applied onto the object 66, for example, a finished LED chip 66' or LED component to form desired thin layers or to deposit the film of the phosphor. Since the number of the suction ports, the communication passages, and the ejection ports for transferring the powder or granular material such as phosphor can be increased, the production can be increased greatly in proportion to their number. The aforementioned contraption is as follows. In the case where the communication channel has an ordinary structure, the powder or granular material passing through the communication channel 64 as a gas-powder mixture diffuses in vacuum instantly when it exits from the ejection port 65, so that the powder or granular material moves toward the chip 66' on the object 66 by the energy of speed and inertia and adheres to the chip 66'. There is no problem with this in forming a coating layer of the powder or granular material. However, in cases where the powder or granular material is applied spotwise or in a spot, there is a problem that the powder or granular material is blown by gas ejected afterward, particularly in cases where the volume of the vacuum chamber is small, the displacement of the vacuum pump is small, and the distance between the ejection port and the chip 66' is short. To address this problem, a branch channel is provided at a location upstream of the ejection port 65, and the cross sectional area of the channel downstream of the branching location is made smaller than, preferably smaller than the half of the cross sectional area of the communication channel. Thereby, a large part of the gas is discharged from a branch port 240 having a large cross sectional area, so that the applied powder or granular material is hardly affected by the gas. Not only one but two or more branch ports may be provided. Since the discharged gas contains a small quantity of powder or granular material, the branch port(s) may be connected to a vacuum pump line by a pipe or the like.

Figure 7:
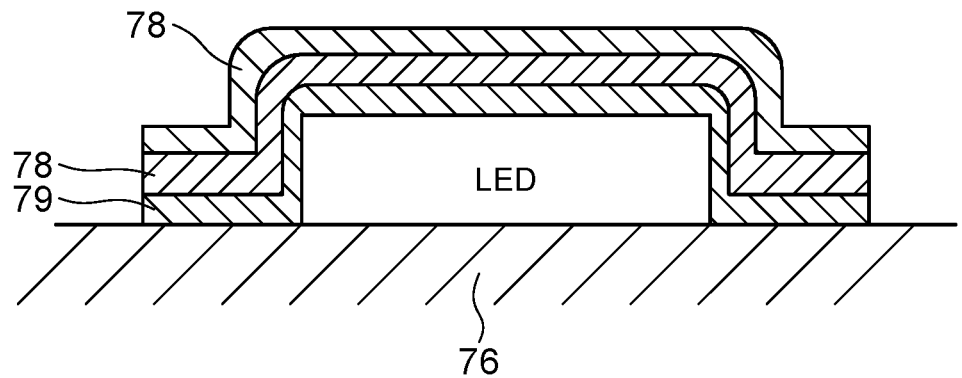
FIG. 7 is a schematic cross sectional view illustrating an embodiment of the present invention.

Referring to FIG. 7, a binder such as a silicone or a binder containing a small quantity of powder or granular material such as phosphor, is coated onto an object such as an LED chip beforehand, and then the powder or granular material such as phosphor is applied and adhered to the binder. By giving higher speed energy to the phosphor, the powder or granular material can penetrate into the binder. Different kinds of or the same kind of phosphor may be applied in multiple layers. Different kinds of or the same kind of phosphor and the binder may be applied in multiple layers. To form a thin binder film, it is preferred that the binder be diluted by a solvent to reduce the viscosity and applied by spraying.

Figure 8:
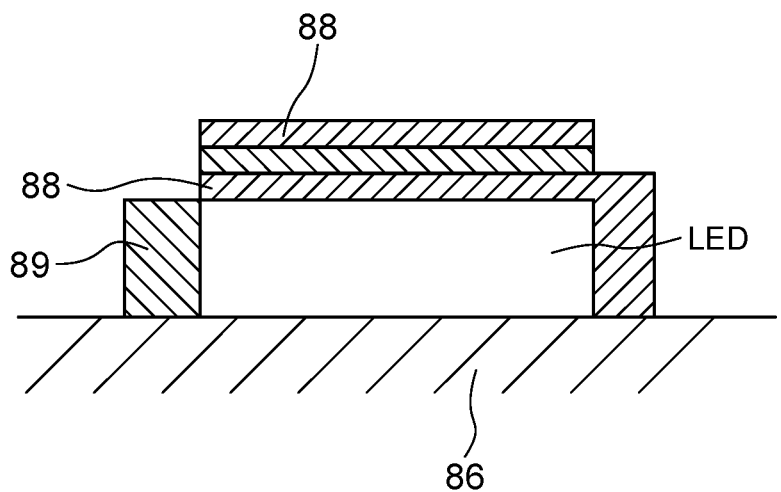
FIG. 8 is a schematic cross sectional view illustrating an embodiment of the present invention.

Referring to FIG. 8, a dam or a masking wall or the like is formed around an LED chip or the like, and the space between the dam or the wall is filled with a slurry containing a binder such as a silicone or a slurry containing a silicone and a small quantity of phosphor to cover the side surface of the LED chip or the like, and thereafter phosphor is applied over it. The binder may be heat-curing silicone. A small quantity of solvent may be added to the filling silicone or the like to reduce the viscosity in order to improve ease of filling.

Figure 9:
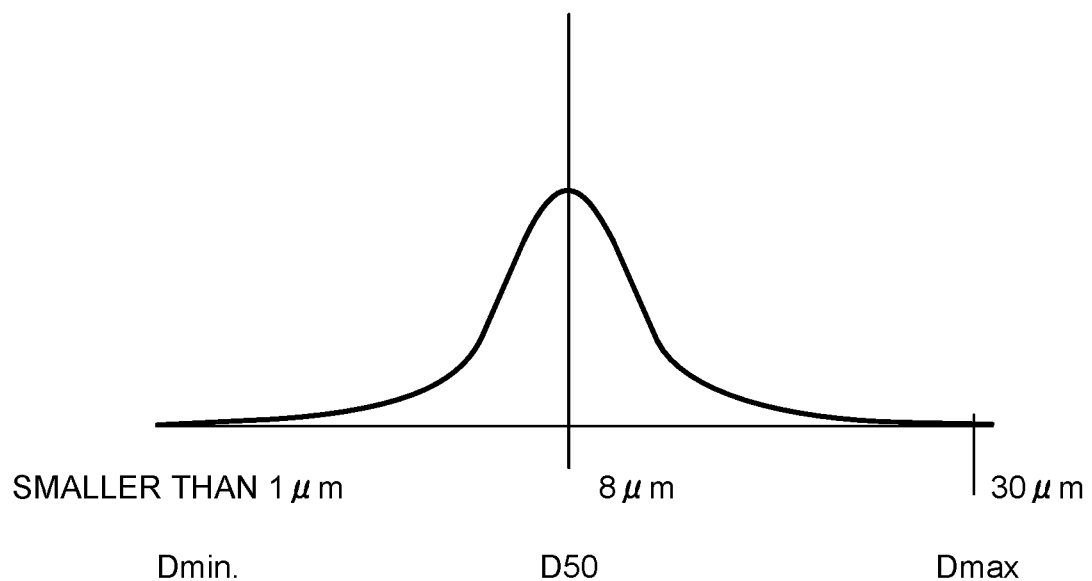
FIG. 9 shows an exemplary grain size distribution of phosphor.

FIG. 9 shows a gain size distribution of an ordinary phosphor for LED.

Figure 10:
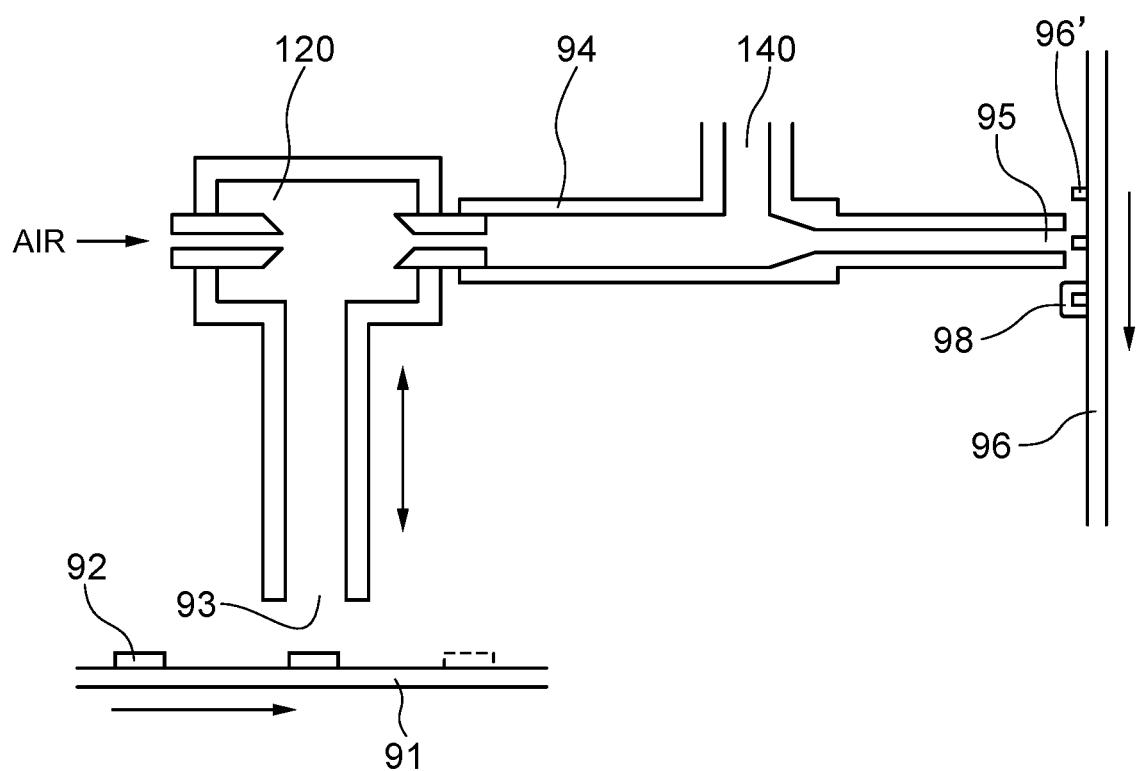
FIG. 10 is a schematic cross sectional view of a system for creating a differential pressure according to an embodiment of the present invention.

FIG. 10 is a cross sectional view of an ejector pump type differential pressure generator. The differential pressure can be created easily by suppling compressed gas into an ejector pump 120. While the compressed air is supplied, the suction port is kept at a negative pressure, so that patterned powder or granular material 92 on a substrate 91 is sucked, transferred through a channel 94, and ejected from an ejection port 95. A branch channel is provided at a location upstream of the ejection port 95, and the cross sectional area of the channel downstream of the branch location is smaller than the cross sectional area of the upstream channel 94, for example smaller than the half the cross sectional area of the upstream channel 94. Thus, surplus gas can be discharged through the branch port, so that the powder or granular material can be applied in a spot pattern 98 without being scattered. Not only one but two or more branch ports may be provided, and the branch port (s) may be connected to an exhaust line by piping or the like. It is preferred that the duration of supply of compressed gas into the ejector be as short as possible to prevent the inflowing of surplus gas. For example, it is preferred that the duration be shorter than 20 milliseconds.

Figure 11:
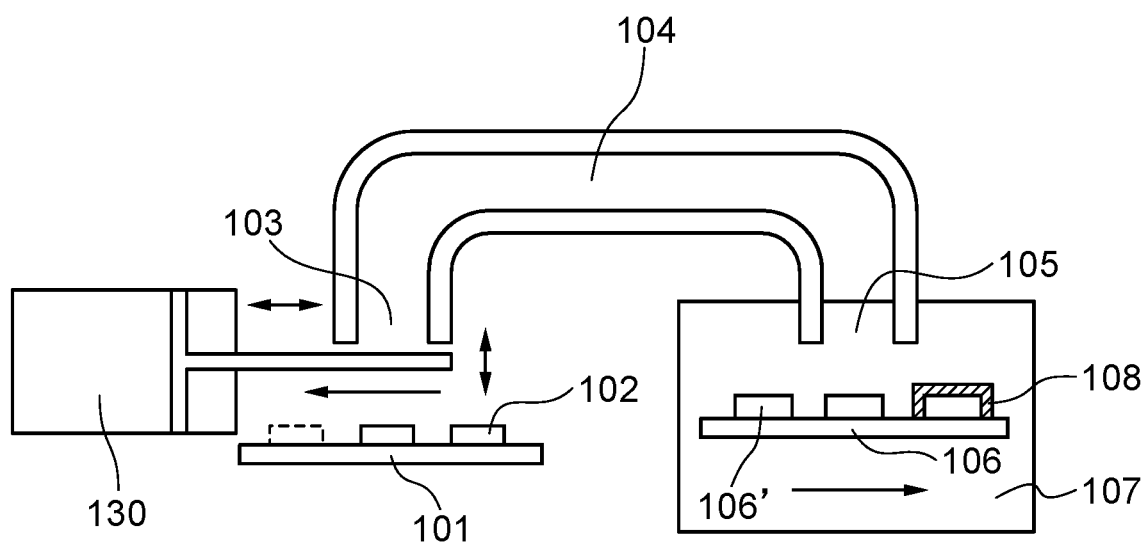
FIG. 11 is a schematic cross sectional view of a system for closing a channel of powder or granular material according to an embodiment of the present invention.

FIG. 11 is a diagram showing a system in which closing means 130 is provided for the basic apparatus shown in FIG. 1. Because the displacement of a vacuum pump (not shown) for the vacuum chamber 107 is reduced and gas staying near the suction port 103 after the application of powder or granular material to objects 106, 106' through an ejection port 105 is sucked and ejected, the applied powder or granular material is blown away. To prevent this, it is important to close the suction port instantaneously at the time when the suction of powder or granular material is finished. Alternatively, the ejection port may be closed instantaneously at the time when the ejection is finished. Still alternatively, a pinch valve or the like (not shown) may be provided in a communication channel 104 and be closed. As described above, this problem can be solved by branching the channel upstream of the ejection port 105 and making the cross sectional area of the channel downstream of the branching location smaller than the cross sectional area of the upstream channel to discharge surplus gas through a branch port provided in the vacuum chamber 107. In any case, it is important for the sake of energy saving to close the channel by the any one of the above described closing means always while application of powder or granular material is not being performed.

By prior art techniques, it is not possible to apply powder or granular material such as phosphor having a widespread grain size distribution in a microscopic area uniformly. It is extremely difficult to form a thin coating by one application process while keeping the variation in the weight per unit area smaller than one square centimeter or one square millimeter within a range of ±3%, preferably ±1.5%. Even in the case where the grain size distribution is sharply peaked, there are small grain portions and large grain portions microscopically as a matter of course, and the grain shapes are not uniform.

With the present invention, it is possible to make the coating weight per unit area of powder or granular material such as phosphor applied to or deposited on an object such as an LED uniform, as described above. To achieve uniform weight per unit area, when applying the powder or granular material such as phosphor in the previous processing step to asubstrate, application is performed in multiple layers while relatively moving the applicator of the powder or granular material and the substrate. Specifically, a first layer is formed by application while moving the substrate pitch-by-pitch and causing the applicator to traverse. Thereafter the second, third, and further layers are formed by application with the pitch phase varied. Alternatively, the application apparatus may be moved pitch-by-pitch and the substrate may be caused to traverse. Alternatively, these two ways of application may be performed alternately to achieve a higher degree of uniformity in the coating weight microscopically. While any method and means for application may be employed without limitations, pulsed spraying is preferable for high efficiency in the adhesion to the substrate. Moreover, at least a coated surface of the substrate may be electrically grounded, and the slurry may be electrostatically charged when applying it. Then, even fine particles can adhere to the substrate, and the degree of uniformity can further be improved. In the case where the powder or granular material is not apt to be electrically charged, it is effective to add a solvent that can be easily charged.

Thus, the weight per unit area or microscopic unit area can be made uniform by the probability also by virtue of the present invention.

In the present invention, the number of the suction ports, communication channels, and ejection ports may be one each. In cases where many kinds of powder or granular materials such as phosphor are used, they may be applied in layers by different apparatuses. In cases where the same kind of phosphor is used, 2 to 1500 suction ports, communication channels, and ejection ports may be provided to shorten the application cycle time, only if the vacuum capacity is large. Taking the total energy into consideration, it is preferred that the average inner diameter of the channel be smaller than 2 millimeters, preferably smaller than 1.5 millimeters.

The present invention is not limited to applying a slurry made of one kind of powder or granular material such as phosphor and a solvent to a substrate in multiple layers by a single applicator, but slurries respectively consisting of plural phosphor may be applied in multiple layers using a plurality of applicators. In the present invention, slurries which consist of a plurality of phosphor may be applied to a plurality of substrates using a plurality of applicators, and the phosphor on the respective substrates may be applied onto an LED or LED component or the like in desired order in multiple layers. The apparatus may be provided with one suction port and one ejection port. The number of suction ports and ejection ports may be increased in accordance with the desired production.

It is possible to manufacture an LED by applying different kinds of phosphor to an LED in multiple layers. The phosphor for forming the layers may be selected at least from red, green, yellow, and blue phosphor. The order of application of the phosphor is not limited. For example, in the case where the LED is one that emits blue light, the phosphor may be applied in layers in descending order of the wavelength of the phosphors. A desired combination of phosphor may be applied in multiple layers on a color-by-color basis while making the weight per unit area as small as possible. The present invention can be applied in converting illumination light emitted from a violet LED or blue laser into white light, as will be appreciated.

When slurry is applied to a substrate, the substrate and the applicator are moved relative to each other. Specifically, one of them is moved stepwise at a desired pitch and the other is caused to traverse to apply the slurry over an area of the substrate. When forming the second and subsequent layers, the pitch may be offset by a length shorter than the length of one side of the LED. The number of times of application may be set equal to the pitch divided by the offset length. This further improves the uniformity of coating distribution. The applicator may be moved pitch-by-pitch, and a cylindrical substrate or a substrate in the form of a film wrapped around a cylinder which can be rotated may be employed. The film may be moved pitch-by-pitch (or intermittently) by a roll-to-roll system.

Likewise, it is preferred to move the ejection port and the object such as an LED relative to each other, to move one of them pitch-by-pitch, to cause the other to traverse to apply coating on the surface of the object, and to apply the second and subsequent layers with an offset, thereby achieving more uniform coating with phosphor. The ejection port may be moved pitch-by-pitch. In cases where an LED mounted on a film is used, the film wrapped around a cylinder may be rotated or moved intermittently.

INDUSTRIAL APPLICABILITY

The present invention can be applied not only to coating of LEDs but also to coating in the fields of semiconductors, electronic parts, biotechnologies, and pharmaceuticals where microscopic distribution or application of powder or granular material including nanoparticles is needed. When applied to aerosol deposition process, the present invention can achieve high quality coating at low cost. Moreover, the present invention can be applied to formation of electrodes of secondary batteries such as LiBs, and formation of electrodes of fuel cells, in particular formation of platinum-supporting carbon electrodes of PEFCs or DMFCs, of which the membrane is delicate to solvent and water, and formation of electrodes of SOFC, which may suffer from bowing in the sintering process if the material of the electrodes is applied as a slurry and the film thickness is large.

REFERENCE SIGNS LIST 1, 11, 21, 31, 41, 51, 61, 71, 91, 101: substrate
2, 12, 22, 32, 42, 52, 62, 102: powder or granular material (phosphor) on substrate
3, 63, 93, 103: suction port
4, 64, 94, 104: communication channel
5, 65, 95, 105: ejection port
6, 66', 96', 106': LED or LED component
7, 87, 107: negative pressure (or vacuum) chamber
8, 68, 78, 88, 98, 108: coating layer
6, 66, 76, 76, 86, 96, 106: object (base plate)
79, 89: binder
140, 240: branch port
150: spray apparatus
160: mask

The invention claimed is:

1. A method for applying a powder or granular material, the method comprising:
  applying at least one kind of powder or granular material to a substrate in such a way that a quantity per unit area of the applied powder or granular material is within ±5% of a predetermined value of weight per square centimeter;
  bringing a suction port for sucking the powder or granular material on the substrate and an ejection port for ejecting the powder or granular material toward an object in communication with each other;
  creating a differential pressure between said suction port and the ejection port and bringing said suction port close to or in contact with the substrate to suck said powder or granular material; and applying the powder or granular material to said object through said ejection port while branching upstream of the ejection port for the powder or granular material to discharge surplus gas through a branch port that is always open.

2. A method of applying powder or granular material according to claim 1,
wherein at least the object, the branch port, and the ejection port are set in a vacuum so as to create a differential pressure between the suction port and at least the ejection port, thereby applying or depositing the powder or granular material onto the object.

3. A method of applying powder or granular material according to claim 1,
wherein the powder or granular material is applied onto said substrate as a stack of multiple layers by an applicator.

4. A method of applying powder or granular material according to claim 3,
wherein application of the powder or granular material to said substrate is performed by relative movement of the substrate and the applicator,
wherein a number of layers in the stack is 2 to 200, and
wherein each layer has a coating weight per square centimeter of 0.01 to 5 milligrams.

5. A method of applying powder or granular material according to claim 1, characterized in that the powder or granular material is applied to said object in 2 to 200 layers.

6. A method of applying powder or granular material according to claim 1, wherein said powder or granular material is for manufacturing secondary batteries.

7. A method of applying powder or granular material according to claim 1, wherein a cross-sectional area of a portion of a flow path of the powder or granular material that is upstream of the branching is greater than a cross-sectional area of a portion of the flow path between the branching and the ejection port.

8. A method of applying powder or granular material according to claim 7, wherein an amount of the powder or granular material in the surplus gas discharged through the branch port is less than an amount of the powder or granular material discharged through the ejection port during the applying the powder or granular material to said object.

9. A method of applying powder or granular material according to claim 1, wherein the powder or granular material applied to the substrate is a coating of one or more layers of the powder or granular material formed on a surface of the substrate.

10. A method of applying powder or granular material, the method comprising:
applying at least one kind of powder or granular material to a substrate in such a way that a quantity per unit area of the applied powder or granular material is within ±5% of a predetermined value of weight per square centimeter;
bringing a suction port for sucking the powder or granular material on the substrate and an ejection port for ejecting the powder or granular material toward an object in communication with each other;
creating a differential pressure between said suction port and the ejection port and bringing said suction port close to or in contact with the substrate to suck said powder or granular material; and
applying the powder or granular material to said object through said ejection port while branching upstream of the ejection port for the powder or granular material to discharge surplus gas through a branch port,
wherein the powder or granular material is applied onto said substrate as a stack of multiple layers by an applicator,
wherein application of the powder or granular material to said substrate is performed by relative movement of the substrate and the applicator,
wherein a number of layers in the stack is 2 to 200,
wherein each layer has a coating weight per square centimeter of 0.01 to 5 milligrams,
wherein said applicator is an atomizing device, which applies a slurry to the substrate, and
wherein the slurry comprises the powder or granular material and a solvent.

11. A method of applying powder or granular material according to claim 10, characterized in that said atomizing device is a spray device or a pulsed spray device, and said substrate or the spray device is moved stepwise at a certain pitch so that multiple coating layers are formed with the pitch phase being varied.

12. A method for applying a powder or granular material, the method comprising:
applying at least one kind of powder or granular material to a substrate in such a way that a quantity per unit area of the applied powder or granular material is within ±5% of a predetermined value of weight per square centimeter;
providing a communication channel that brings a suction port for sucking the powder or granular material on the substrate and an ejection port for ejecting the powder or granular material toward an object in communication with each other;
providing a channel closing mechanism in a flow path for the powder or granular material between said substrate and the object;
setting at least said object and the ejection port in vacuum to create a differential pressure between the suction port and the ejection port; and
bringing said suction port close to or in contact with the substrate while opening said channel closing mechanism to suck said powder or granular material, and applying or depositing the powder or granular material onto said object by ejecting the powder or granular material from said ejection port to the object while discharging surplus gas through a branch port that is always open.

13. A method of applying powder or granular material according to claim 12,
wherein multiple suction ports are provided for the substrate, multiple ejection ports are provided for the object, and multiple communication channels are provided, and
wherein a number of each of the suction ports, the ejection ports, and the communication channels is 2 to 1500.

14. A method of applying powder or granular material according to claim 12,
wherein a binder is coated onto the object prior to the applying or depositing the powder or granular material onto said object.

15. A method of applying powder or granular material according to claim 12,
wherein a branch to a branch port, for continuous discharge of surplus gas during the applying or depositing the power or granular material onto said object, is upstream from the ejection port, wherein a cross-sectional area of the communication channel upstream of the branch is greater than a cross-sectional area of a flow path between the branch and the ejection port.

16. A method of applying powder or granular material according to claim 12, further comprising:
after the applying or depositing the powder or granular material onto the object, closing the channel closing mechanism,
wherein the channel closing mechanism closes the suction port or the ejection port, or comprises a valve that closes the communication channel.

17. A method of applying a powder or granular material, the method comprising:
applying at least one kind of powder or granular material to a substrate in such a way that a quantity per unit area of the applied powder or granular material is made uniform;
bringing a suction port for sucking the powder or granular material on the substrate and an ejection port for ejecting the powder or granular material toward an object in communication with each other;
creating a differential pressure between said suction port and the ejection port;
bringing said suction port close to or in contact with the substrate to suck said powder or granular material; and
applying the powder or granular material to said object through said ejection port while branching upstream of the ejection port for the powder or granular material to discharge surplus gas through a branch port,
wherein said powder or granular material is a phosphor, and said object is an LED or an LED component, and
wherein the phosphor on the substrate comprises layers of phosphors of different colors.

18. A method of applying a powder or granular material, the method comprising:
applying at least one kind of powder or granular material to a substrate in such a way that a quantity per unit area of the applied powder or granular material is made uniform;
bringing a suction port for sucking the powder or granular material on the substrate and an ejection port for ejecting the powder or granular material toward an object in communication with each other;
creating a differential pressure between said suction port and the ejection port;
bringing said suction port close to or in contact with the substrate to suck said powder or granular material; and
applying the powder or granular material to said object through said ejection port while branching upstream of the ejection port for the powder or granular material to discharge surplus gas through a branch port,
wherein said powder or granular material is a phosphor, and said object is an LED or an LED component,
wherein slurries respectively consisting of different kinds of phosphor are applied onto a plurality of substrates by a plurality of applicators, and
wherein the phosphors on the respective substrates are applied onto the LED or LED component in multiple layers.

19. A method of applying powder or granular material, the method comprising:
applying at least one kind of powder or granular material to a substrate in such a way that a quantity per unit area of the applied powder or granular material is within ±5% of a predetermined value of weight per square centimeter;
bringing a suction port for sucking the powder or granular material on the substrate and an ejection port for ejecting the powder or granular material toward an object in communication with each other;
creating a differential pressure between said suction port and the ejection port and bringing said suction port close to or in contact with the substrate to suck said powder or granular material; and
applying the powder or granular material to said object through said ejection port while branching upstream of the ejection port for the powder or granular material to discharge surplus gas through a branch port,
wherein both the ejection port and the branch port discharge to a common vacuum chamber.

20. A method of applying powder or granular material, the method comprising:
applying at least one kind of powder or granular material to a substrate in such a way that a quantity per unit area of the applied powder or granular material is within ±5% of a predetermined value of weight per square centimeter;
bringing a suction port for sucking the powder or granular material on the substrate and an ejection port for ejecting the powder or granular material toward an object in communication with each other;
creating a differential pressure between said suction port and the ejection port and bringing said suction port close to or in contact with the substrate to suck said powder or granular material; and
applying the powder or granular material to said object through said ejection port while branching upstream of the ejection port for the powder or granular material to discharge surplus gas through a branch port,
wherein the applying at least one kind of powder or granular material to the substrate comprises:
applying a slurry to a surface of the substrate, the slurry comprising a solvent and the powder or granular material; and
after the applying a slurry, evaporating the solvent so as to form a layer of the powder or granular material on the surface of the substrate.

* * * * *